United States Patent
Buh et al.

(10) Patent No.: US 7,683,421 B2
(45) Date of Patent: Mar. 23, 2010

(54) NAND-TYPE FLASH MEMORY DEVICES INCLUDING SELECTION TRANSISTORS WITH AN ANTI-PUNCHTHROUGH IMPURITY REGION AND METHODS OF FABRICATING THE SAME

(75) Inventors: Gyoung-Ho Buh, Gyeonggi-do (KR);
Sun-Ghil Lee, Gyeonggi-do (KR);
Jong-Ryeol Yoo, Gyeonggi-do (KR);
Deok-Hyung Lee, Seoul (KR);
Guk-Hyon Yon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/849,533

(22) Filed: Sep. 4, 2007

(65) Prior Publication Data
US 2008/0083944 A1 Apr. 10, 2008

(30) Foreign Application Priority Data
Sep. 4, 2006 (KR) ...................... 10-2006-0084786

(51) Int. Cl.
*H01L 29/10* (2006.01)
(52) U.S. Cl. ........................ 257/314; 257/202; 257/315; 257/316; 257/E29.063
(58) Field of Classification Search ................. 257/202, 257/314, 315, 316, E29.063
See application file for complete search history.

(56) References Cited

U.S. PATENT DOCUMENTS 5,677,556 A   10/1997  Endoh
6,774,433 B2 * 8/2004  Lee et al. ..................... 257/326
2003/0123307 A1 * 7/2003  Lee et al. ..................... 365/200

FOREIGN PATENT DOCUMENTS

| JP | 07-147406 | 6/1995 |
|---|---|---|
| KR | 1020000019969 A | 4/2000 |
| KR | 1020020062431 A | 7/2002 |
| KR | 1020050112992 A | 12/2005 |
| KR | 1020050123454 A | 12/2005 |
| KR | 1020060036541 A | 5/2006 |

OTHER PUBLICATIONS

Korean Notice of Decision to Grant Patent and English Translation (3 pages) corresponding to Korean Patent Application No. 10-2006-0084786; Issued Jul. 21, 2008.

* cited by examiner

*Primary Examiner*—Victor A Mandala
(74) *Attorney, Agent, or Firm*—Myers Bigel Sibley & Sajovec, P.A.

(57) ABSTRACT

A NAND-type flash memory device including selection transistors is provided. The device includes first and second impurity regions formed in a semiconductor substrate, and first and second selection gate patterns disposed on the semiconductor substrate between the first and second impurity regions. The first and second selection gate patterns are disposed adjacent to the first and second impurity regions, respectively. A plurality of cell gate patterns are disposed between the first and second selection gate patterns. A first anti-punchthrough impurity region that surrounds the first impurity region is provided in the semiconductor substrate. The first anti-punchthrough impurity region overlaps with a first edge of the first selection gate pattern adjacent to the first impurity region. A second anti-punchthrough impurity region that surrounds the second impurity region is provided in the semiconductor substrate. The second anti-punchthrough impurity region overlaps with a first edge of the second selection gate pattern adjacent to the second impurity region.

20 Claims, 5 Drawing Sheets

FIG. 6

NAND-TYPE FLASH MEMORY DEVICES INCLUDING SELECTION TRANSISTORS WITH AN ANTI-PUNCHTHROUGH IMPURITY REGION AND METHODS OF FABRICATING THE SAME

CROSS-REFERENCE TO RELATED APPLICATION

This application claims priority to Korean Patent Application No. 10-2006-84786, filed Sep. 4, 2006, the disclosure of which is hereby incorporated herein by reference in its entirety.

BACKGROUND OF THE INVENTION

1. Field of the Invention

The present invention relates non-volatile memory devices and, more particularly, to NAND-type flash memory devices including selection transistors with anti-punchthrough impurity regions and methods of fabricating the same.

2. Description of the Related Art

NAND-type flash memory devices typically exhibit a slower operating speed than NOR-type flash memory devices. However, NAND-type flash memory devices may have the advantage of integration density as compared to NOR-type flash memory devices. Therefore, NAND-type flash memory devices are widely used for storing image data of digital cameras or micro-codes of cellular phones, for example.

As NAND-type flash memory devices become more highly integrated, the short channel effect of cell transistors and selection transistors has been more serious. To suppress the short channel effect of the cell transistors and the selection transistors, a method of increasing channel concentration has been widely used. However, when the channel concentration of the cell transistors and the selection transistors is increased, some problems may occur. For example, channel capacitance and source/drain junction capacitance of the cell transistors may increase to degrade the self-boosting effect of a non-selected string in a programming mode. As a result, the cell transistors of the non-selected string may be programmed. Also, when the channel concentration of the selection transistors increases, the channel hot carrier effect of the selection transistors (particularly ground selection transistors) in the non-selected string may occur in a program mode. In this case, cell transistors adjacent to the selection transistors can be programmed. Therefore, there may limitations in suppressing the short channel effect of the selection transistors and cell transistors using a method of increasing the channel concentration.

Figure 1:
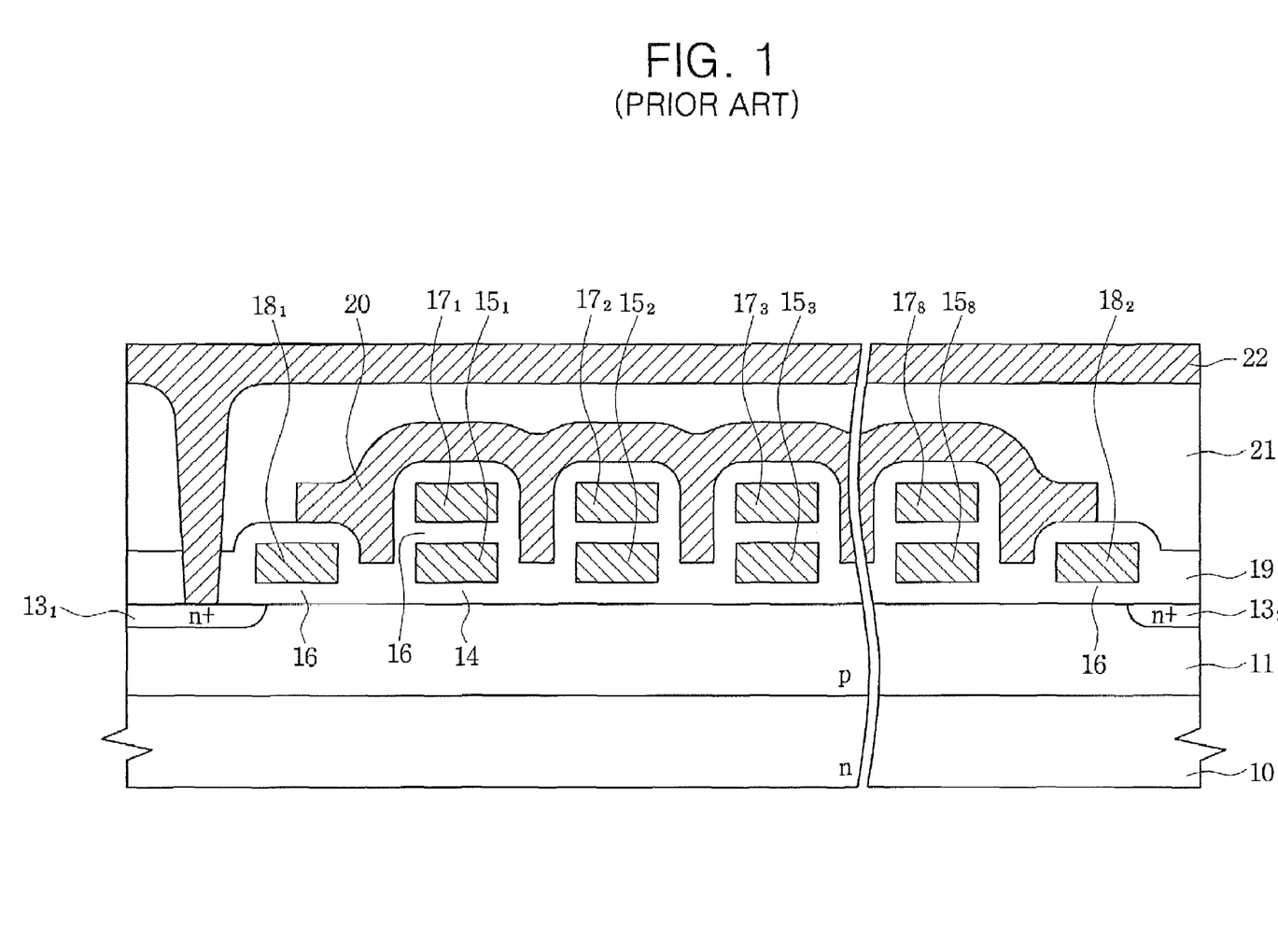
FIG. 1 is a cross-sectional view illustrating a string of a conventional NAND-type flash memory device.

FIG. 1 is a cross-sectional view illustrating a string of a NAND-type flash memory device disclosed in U.S. Pat. No. 5,677,556, and FIG. 2 is a cross-sectional view illustrating a non-selected string in a program mode of a conventional NAND-type flash memory device including the string shown in FIG. 1 and a bias condition applied to the non-selected string.

Referring to FIG. 1, a p-type well 11 is provided in an n-type semiconductor substrate 10, and an isolation layer (not shown) is formed in a predetermined region of the p-type well 11 to provide an active region. A string selection line $18_1$ and a ground selection line $18_2$ are disposed to cross over the active region, and first to eighth word lines $17_1$ to $17_8$ are disposed to cross over an active region between the string selection line $18_1$ and the ground selection line $18_2$. First to eighth floating gates $15_1$ to $15_8$ are interposed between the word lines $17_1$ to $17_8$ and the active region, respectively. The word lines $17_1$ to $17_8$ are insulated from the floating gates $15_1$ to $15_8$ by an inter-gate insulating layer 16, and the floating gates $15_1$ to $15_8$ are insulated from the active region (i.e., the p-type well 11) by a tunnel oxide layer 14. Further, the selection lines $18_1$ and $18_2$ are insulated from the p-type well 11 by the inter-gate insulating layer 16.

A bit line impurity region $13_1$ is provided in the p-type well 11 that is adjacent to the string selection line $18_1$ and opposite to the first floating gate $15_1$, and a common source impurity region $13_2$ is provided in the p-type well 11 that is adjacent to the ground selection line $18_2$ and opposite to the eighth floating gate $15_8$. The selection lines $18_1$ and $18_2$, the word lines $17_1$ to $17_8$, and the impurity regions $13_1$ and $13_2$ are covered with an insulating layer 19, and a conductive inversion gate 20 is provided on the insulating layer 19. The conductive inversion gate 20 extends into gap regions between the selection lines $18_1$ and $18_2$ and the word lines $17_1$ to $17_8$ to be adjacent to the p-type well 11. The conductive inversion gate 20 and the insulating layer 19 are covered with an interlayer insulating layer 21, and a bit line 22 is provided on the interlayer insulating layer 21. The bit line 22 passes through the interlayer insulating layer 21 and the insulating layer 19 and is electrically connected to the bit line impurity region $13_1$.

Figure 2:
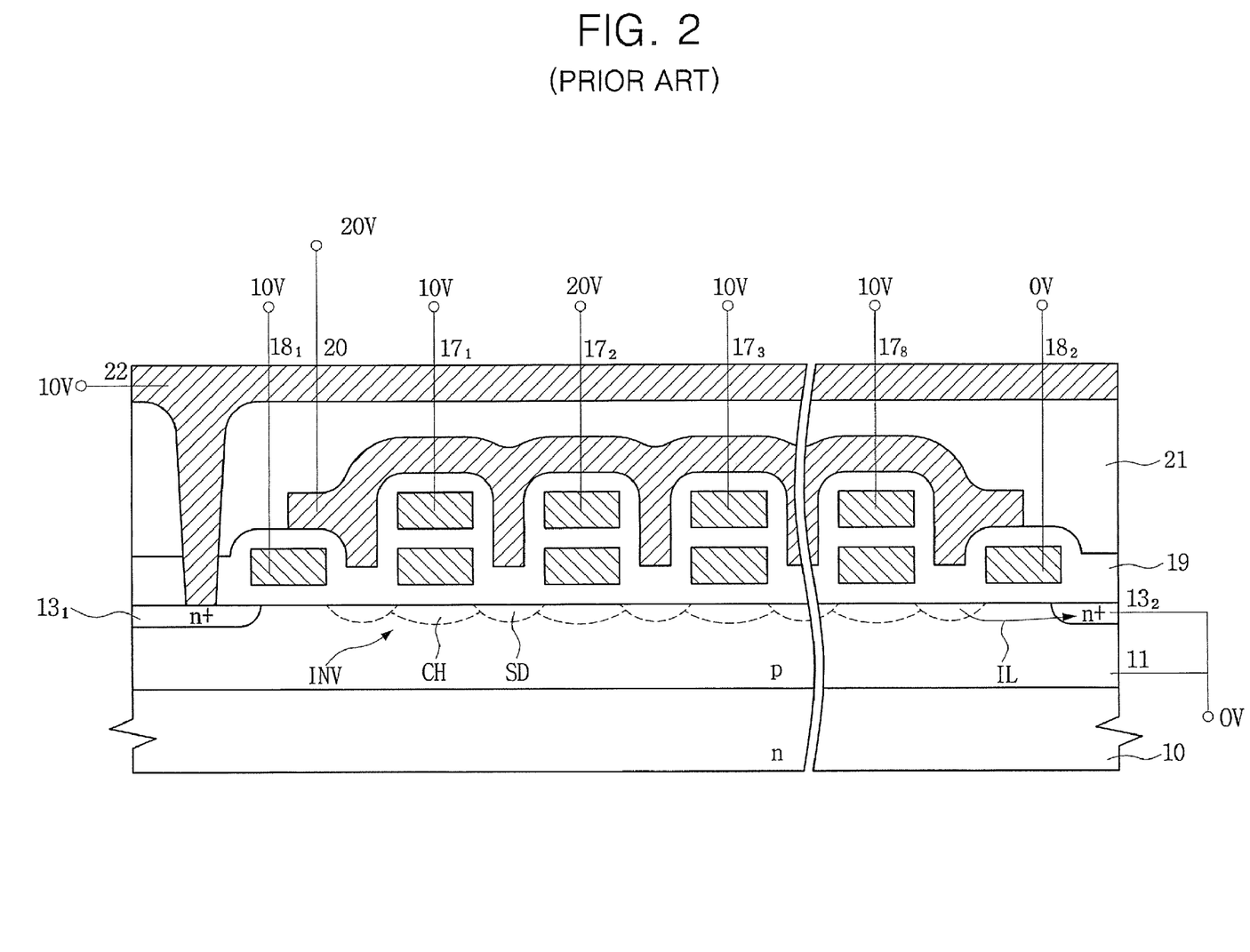
FIG. 2 is a cross-sectional view illustrating a non-selected string in a program mode of a conventional NAND-type flash memory device and a bias condition applied to the non-selected string.

In a program mode of a conventional NAND-type flash memory device, a non-selected string may be under the bias condition illustrated in FIG. 2.

Referring to FIG. 2, a program voltage may be applied to any one of the first to eighth word lines $17_1$ to $17_8$. For example, a program voltage of 20V may be applied to the second word line $17_2$. In this case, a pass voltage of 10V may be applied to the first word line $17_1$ and the third to eighth word lines $17_3$ to $17_8$, and 10V and 0V may be applied to the string selection line $18_1$ and the ground selection voltage $18_2$, respectively. Also, the common source impurity region $13_2$ and the p-type well 11 are grounded to have a voltage of 0V, and a voltage of 10V may be applied to the bit line 22. Therefore, a ground selection transistor having the ground selection line $18_2$, which functions as a gate electrode, is turned off, and channel inversion layers CH may be formed in channel regions below the word lines $17_1$ to $17_8$.

Furthermore, a high voltage of 20V may be applied to the inversion gate 20. As a result, source/drain inversion layers SD may be formed in the p-type well 11 between the channel inversion layers CH. The channel inversion layers CH and the source/drain inversion layers SD constitute an inversion layer INV that is electrically isolated from the common source impurity region $13_2$. Accordingly, the inversion layer INV is self-boosted by coupling capacitance between the word lines $17_1$ to $17_8$, thereby having a voltage between a potential of the p-type well 11 and 10V.

To reduce the likelihood of all cell transistors of the non-selected string from being programmed, a boosted voltage of the inversion layer INV has to be high enough. A junction capacitance between the inversion layer INV and the p-type well 11 may be reduced to increase the boosted voltage of the inversion layer INV. In other words, the impurity concentration of the p-type well 11 may be lowered to increase the boosted voltage of the inversion layer INV. However, when the impurity concentration of the p-type well 11 is lowered, a leakage current IL may flow due to a punchthrough phenomenon between the inversion layer INV and the impurity regions $13_1$ and $13_2$. Particularly, the leakage current IL may easily flow between the inversion layer INV and the common source impurity regions $13_2$.

When the leakage current IL flows between the inversion layer INV and the common source impurity regions $13_1$ and $13_2$ due to a punchthrough phenomenon, the boosted voltage of the inversion layer INV is lowered and the cell transistors of the non-selected string may be programmed. Furthermore, the inversion gate 20 may be interposed between the word lines $17_1$ to $17_8$ and the selection lines $18_1$ and $18_2$. Thus, there may be a limitation in reducing or minimizing space between the word lines $17_1$ to $17_8$ and the selection lines $18_1$ and $18_2$. Consequently, it may be difficult to improve the integration density of a NAND-type flash memory device due to the presence of the inversion gate 20.

SUMMARY OF THE INVENTION

According to some embodiments of the present invention, a NAND-type flash memory device includes selection transistors with an anti-punchthrough impurity region. The memory device includes first and second impurity regions formed in a semiconductor substrate. First and second selection gate patterns are disposed on the semiconductor substrate between the first and second impurity regions. The first and second selection gate patterns are disposed adjacent to the first and second impurity regions, respectively. A plurality of cell gate patterns are disposed between the first and second selection gate patterns. A first anti-punchthrough impurity region that surrounds the first impurity region is provided in the semiconductor substrate. The first anti-punchthrough impurity region overlaps with a first edge of the first selection gate pattern adjacent to the first impurity region. A second anti-punchthrough impurity region that surrounds the second impurity region is provided in the semiconductor substrate. The second anti-punchthrough impurity region overlaps with a first edge of the second selection gate pattern adjacent to the second impurity region. The semiconductor substrate between the first and second anti-punchthrough impurity regions has a substantially uniform impurity concentration along a direction parallel to the surface of the semiconductor substrate.

In other embodiments of the present invention, the NAND-type flash memory device includes first and second elevated semiconductor patterns formed on a semiconductor substrate. First and second selection gate patterns are disposed over the semiconductor substrate between the first and second elevated semiconductor patterns. The first and second selection gate patterns are disposed adjacent to the first and second elevated semiconductor patterns, respectively. A plurality of cell gate patterns are disposed between the first and second selection gate patterns. The first and second elevated semiconductor patterns have a different conductivity type from the semiconductor substrate, and the semiconductor substrate between the first and second elevated semiconductor patterns has a substantially uniform impurity concentration along a direction parallel to the surface of the semiconductor substrate.

In still other embodiments of the present invention, a method of fabricating a NAND-type flash memory device is provided. The method includes forming an isolation layer in a semiconductor substrate to define an active region, and forming first and second selection gate patterns that cross over the active region as well as a plurality of cell gate patterns between the first and second selection gate patterns. Insulating spacer patterns that fill regions between the selection gate patterns and the cell gate patterns as well as insulating spacers covering outer sidewalls of the selection gate patterns are formed. First and second impurity regions are formed in the active region adjacent to the insulating spacer on the outer sidewall of the first selection gate pattern and the active region adjacent to the insulating spacer on the outer sidewall of the second selection gate pattern, respectively. The first and second impurity regions are formed to have a different conductivity type from the semiconductor substrate. A first anti-punchthrough impurity region that surrounds the first impurity region and a second anti-punchthrough impurity region that surrounds the second impurity region are formed. The first anti-punchthrough impurity region is formed to overlap with a first edge of the first selection gate pattern adjacent to the first impurity region, and the second anti-punchthrough impurity region is formed to overlap with a first edge of the second selection gate pattern adjacent to the second impurity region. The first and second anti-punchthrough impurity regions are formed to have the same conductivity type as the semiconductor substrate.

In further embodiments of the present invention, the method includes forming an isolation layer in a semiconductor substrate to define an active region, and forming first and second selection gate patterns that cross over the active region as well as a plurality of cell gate patterns between the first and second selection gate patterns. Insulating spacer patterns that fill regions between the selection gate patterns and the cell gate patterns, and insulating spacers that cover outer sidewalls of the selection gate patterns are formed. First and second elevated semiconductor patterns are formed on both ends of the active region adjacent to the insulating spacers. The first and second elevated semiconductor patterns are formed to have a different conductivity type from the semiconductor substrate.

BRIEF DESCRIPTION OF THE DRAWINGS

Other features of the present invention will be more readily understood from the following detailed description of exemplary embodiments thereof when read in conjunction with the accompanying drawings, in which.

DETAILED DESCRIPTION OF THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

Figure 3:
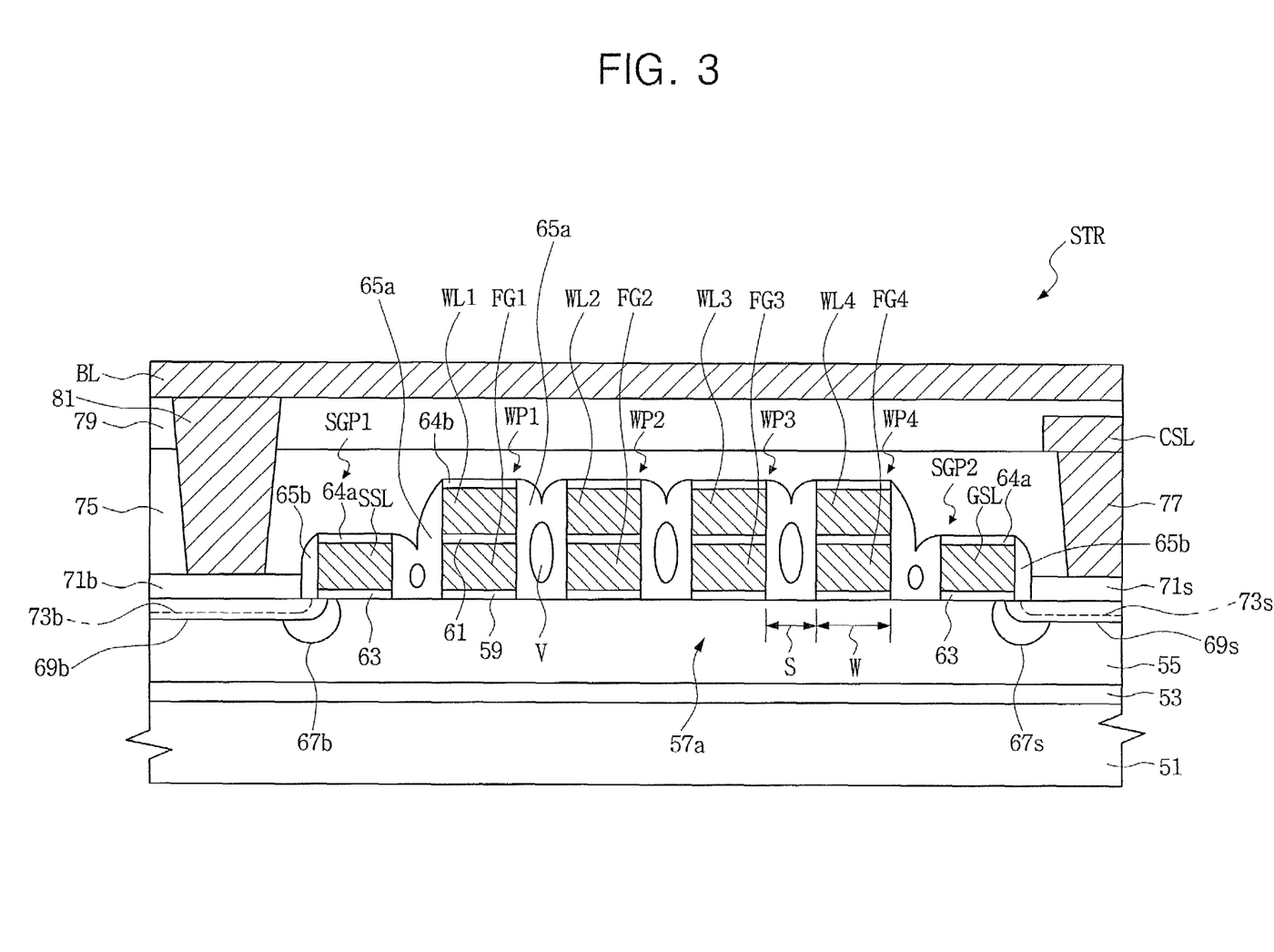
FIG. 3 is a cross-sectional view illustrating a string of a NAND-type flash memory device according to some embodiments of the present invention.

FIG. 3 is a cross-sectional view illustrating a string STR of a NAND-type flash memory device according to some embodiments of the present invention.

Referring to FIG. 3, a deep well 53 of a first conductivity type may be provided on a semiconductor substrate 51, and a pocket well 55 of a second conductivity type may be provided on the deep well 53 of the first conductivity type. The first and second conductivity types may be n-type and p-type, respectively. An isolation layer (not shown) is provided on a predetermined region of the substrate having the pocket well 55, thereby defining an active region 57a. First and second impurity regions 69b and 69s spaced apart from each other may be provided in the active region 57a. The first and second impurity regions 69b and 69s may correspond to a bit line impurity region and a common source impurity region, respectively. The first and second impurity regions 69b and 69s may have a different conductivity type from the pocket well 55. For example, when the pocket well 55 is a p-type well, the first and second impurity regions 69b and 69s may be n-type impurity regions.

First and second selection lines may be disposed to cross over the active region 57a between the first and second impurity regions 69b and 69s. The first and second selection lines may correspond to a string selection line SSL and a ground selection line GSL, respectively. The string selection line SSL may be insulated from the active region 57a by a gate insulating layer 63, and the ground selection line GSL may also be insulated from the active region 57a by the gate insulating layer 63. The string selection line SSL and the underlying gate insulating layer 63 constitute a first selection gate pattern SGP1, i.e., a string selection gate pattern, and the ground selection line GSL and the underlying gate insulating layer 63 constitute a second selection gate pattern SGP2, i.e., a ground selection gate pattern. In addition, each of the first and second selection gate patterns SGP1 and SGP2 may further include a capping insulating layer 64a, which is stacked on the respective selection lines SSL and GSL.

A plurality of cell gate patterns may be disposed to cross over the active region 57a between the first and second selection gate patterns SGP1 and SGP2. In some embodiments, the cell gate patterns include first to fourth cell gate patterns WP1, WP2, WP3 and WP4. It will be understood, however, that the number of cell gate patterns is not limited to 4 in accordance with various embodiments of the present invention. For example, the number of cell gate patterns may be 8, 16, 32 or 64. The first cell gate pattern WP1 may include a first floating gate FG1 and a first word line WL1, which are sequentially stacked, and the second cell gate pattern WP2 may include a second floating gate FG2 and a second word line WL2, which are sequentially stacked. Similarly, the third cell gate pattern WP3 may include a third floating gate FG3 and a third word line WL3, which are sequentially stacked, and the fourth cell gate pattern WP4 may include a fourth floating gate FG4 and a fourth word line WL4, which are sequentially stacked. The word lines WL1, WL2, WL3 and WL4 correspond to control gate electrodes. Each of the cell gate patterns WP1, WP2, WP3 and WP4 may further include a capping insulating layer 64b, which is stacked on the respective word lines WL1, WL2, WL3 and WL4. A tunnel insulating layer 59 may be interposed between the floating gates FG1, FG2, FG3 and FG4 and the active region 57a, and an inter-gate insulating layer 61 may be interposed between the word lines WL1, WL2, WL3 and WL4 and the floating gates FG1, FG2, FG3 and FG4.

According to the embodiments described above, the cell gate patterns WP1, WP2, WP3 and WP4 have a stacked gate structure. Embodiments of the present invention, however, are not limited to a NAND-type flash memory device having a stacked gate structure. For example, the present invention may also be embodied as a NAND-type flash memory device having a semiconductor-oxide-nitride-oxide-semiconductor (SONOS) type gate structure.

Spaces S between the selection gate patterns SGP1 and SGP2 and the cell gate patterns WP1, WP2, WP3 and WP4 may be less than half of the width W of the respective cell gate patterns WP1, WP2, WP3 and WP4. Gap regions between the selection gate patterns SGP1 and SGP2 and the cell gate patterns WP1, WP2, WP3 and WP4 may be filled with insulating spacer patterns 65a, and outer sidewalls of the selection gate patterns SGP1 and SGP2, which are adjacent to the first and second impurity regions 69b and 69s, may be covered with an insulating spacer 65b. Each of the insulating spacer patterns 65a may have an empty space (i.e., a void V) therein. In this case, a parasitic capacitance between the adjacent gate patterns may decrease to improve an operating speed of the flash memory device.

The first selection line SSL has a first edge adjacent to the first impurity region 69b and a second edge adjacent to the first cell gate pattern WP1. Similarly, the second selection line GSL has a first edge adjacent to the second impurity region 69s and a second edge adjacent to the fourth cell gate pattern WP4. A first anti-punchthrough impurity region 67b may be provided below the first edge of the first selection line SSL, and a second anti-punchthrough impurity region 67s may be provided below the first edge of the second selection line GSL. The first and second anti-punchthrough impurity regions 67b and 67s may be provided to surround the first and second impurity regions 69b and 69s, respectively.

The first and second anti-punchthrough impurity regions 67b and 67s have the same conductivity type as the pocket well 55, and the impurity concentration of the first and second anti-punchthrough impurity regions 67b and 67s is higher than that of the pocket well 55. In some embodiments of the present invention, an impurity region (for example, source and drain regions) is not provided in the active region 57a between the first and second anti-punchthrough impurity regions 67b and 67s. That is, the active region 57a between the first and second anti-punchthrough impurity regions 67b and 67s may have an initial impurity concentration of the pocket well 55. Thus, the active region 57a between the first and second anti-punchthrough impurity regions 67b and 67s may have a substantially uniform impurity concentration along a direction parallel to the surface of the active region 57a.

In other embodiments of the present invention, first and second elevated semiconductor patterns 71b and 71s may be provided on the first and second impurity regions 69b and 69s, respectively. The first and second elevated semiconductor patterns 71b and 71s may be epitaxial semiconductor patterns, and may have a different conductivity type from the pocket well 55. For example, when the pocket well 55 is a p-type well, the first and second elevated semiconductor patterns 71b and 71s may be semiconductor patterns, which are doped with n-type impurities.

When the first and second elevated semiconductor patterns 71b and 71s are provided, the impurity regions 69b and 69s and/or the anti-punchthrough impurity regions 67b and 67s may not be provided. When the impurity regions 69b and 69s are not provided, impurities in the first and second elevated semiconductor patterns 71b and 71s are diffused into the active region 57a to form first and second impurity regions 73b and 73s, which correspond to the first and second impurity regions 69b and 69s respectively. In this case, the first and second impurity regions 73b and 73s may have thinner junction depths than the first and second impurity regions 69b and 69s. As a result, short channel effects of a first selection transistor (i.e., a string selection transistor) using the first selection line SSL as a gate electrode and a second selection transistor (i.e., a ground selection transistor) using the second selection line GSL as a gate electrode may be significantly suppressed. When the elevated semiconductor patterns 71b and 71s are provided, the gate patterns may include the capping insulating layers 65a and 65b.

A first interlayer insulating layer 75 may be provided on the substrate having the elevated semiconductor patterns 71b and 71s, and a common source line CSL may be disposed on the first interlayer insulating layer 75. The common source line CSL may be electrically connected to the second elevated semiconductor pattern 71s or the second impurity region 69s through a source contact plug 77 in the first interlayer insulating layer 75.

The substrate having the common source line CSL is covered with a second interlayer insulating layer 79, and a bit line BL may be disposed on the second interlayer insulating layer 79. The bit line BL may be electrically connected to the first elevated semiconductor pattern 71b or the first impurity region 69b through a bit line contact plug 81, which passes through the first and second interlayer insulating layers 75 and 79.

Figure 4:
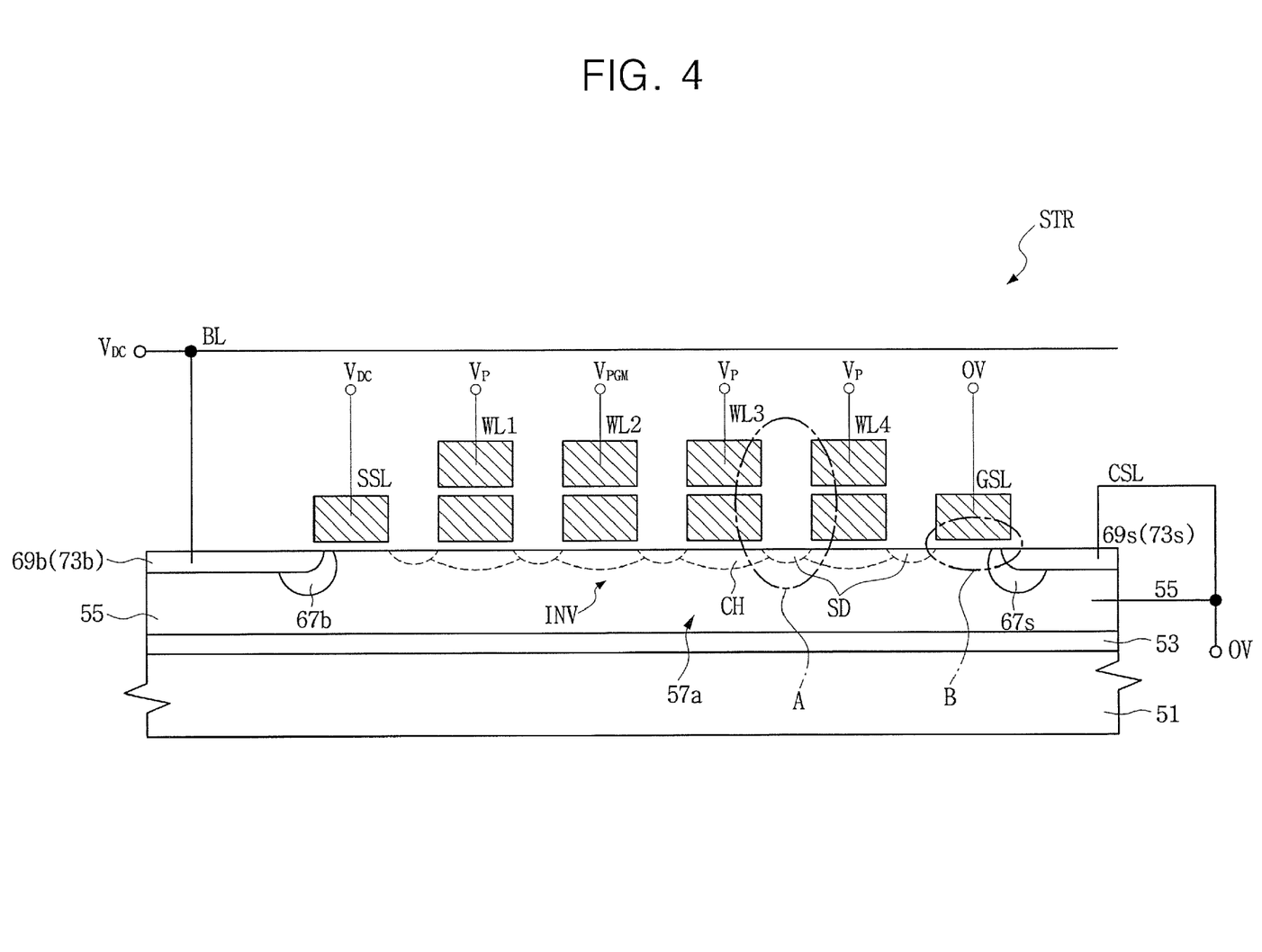
FIG. 4 is a cross-sectional view illustrating a non-selected string of FIG. 3 and a bias condition applied thereto when the string of FIG. 3 is not selected in a program mode according to some embodiments of the present invention.
Figure 5:
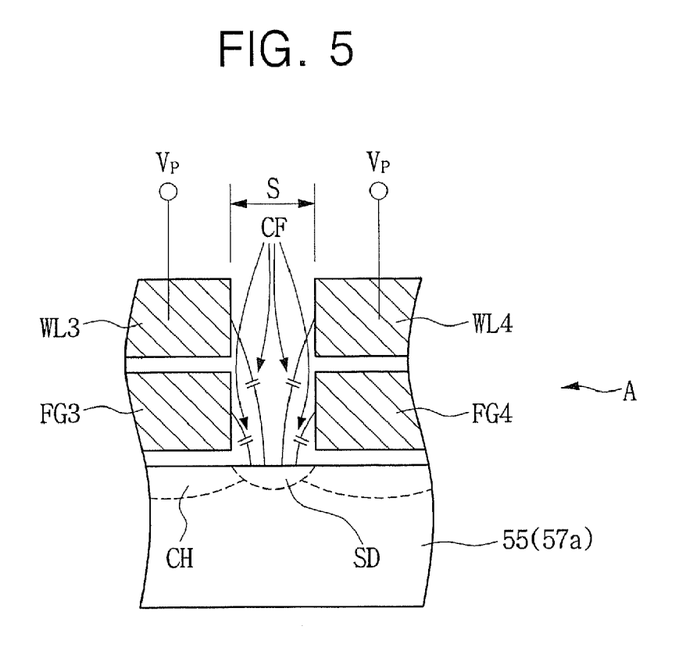
FIG. 5 is an enlarged cross-sectional view of a portion A of FIG. 4 to illustrate generation of a source/drain inversion layer of FIG. 4 according to some embodiments of the present invention.

FIG. 4 is a cross-sectional view illustrating a string STR of FIG. 3 and a bias condition applied thereto in a program mode when the string STR is non-selected and the non-selected string shares word lines of a selected string, and FIG. 5 is an enlarged cross-sectional view of a region "A" of FIG. 4 to illustrate a creation mechanism of the source/drain inversion layers SD of FIG. 4.

Referring to FIG. 4, a program voltage $V_{PGM}$ is applied to at least one selected word line among the word lines WL1, WL2, WL3 and WL4 of the non-selected string STR, and a pass voltage $V_P$, which is lower than the program voltage $V_{PGM}$, is applied to non-selected word lines. For example, the program voltage $V_{PGM}$ may be applied to the second word line WL2, and the pass voltage $V_P$ may be applied to the first, third and fourth word lines WL1, WL3 and WL4. Also, the second selection line GSL, the common source line CSL and the pocket well 55 may be grounded, and a program inhibition voltage $V_{DC}$ may be applied to the first selection line SSL and the bit line BL. The program voltage $V_{PGM}$ may be within the range of about 15 to 20V, and the pass voltage $V_P$ may be within the range of about 8 to 10V. Also, the program inhibition voltage $V_{DC}$ may be within the range of about 5 to 10V.

Under the aforementioned bias condition, channel inversion layers CH may be formed in the active region 57a below the word lines WL1, WL2, WL3 and WL4. The channel inversion layers CH correspond to inversion layers induced by the pass voltage $V_P$ and program voltage $V_{PGM}$ applies to the word lines WL1, WL2, WL3 and WL4. Thus, the channel inversion layers CH may have a different conductivity type from the pocket well 55. For example, the pocket well 55 may be a p-type well, and the channel inversion layers CH may be n-type inversion layers. On the other hand, no channel inversion layer is formed in the active region 57a below the first and second selection lines SSL and GSL. This is because the string selection transistor and the ground selection transistor respectively using the first and second selection lines SSL and GSL as gate electrodes are turned off under the aforementioned bias condition. Particularly, although a gate voltage of about 5 to 10V is applied to the first selection line SSL as described above, the string selection transistor may be turned off. This is because the first impurity region 69b functions as a source region of the string selection transistor and the first selection line SSL has the same potential as the first impurity region 69b under the bias condition shown in FIG. 4.

Meanwhile, source/drain inversion layers SD may be formed in the active region 57a between the word lines WL1, WL2, WL3 and WL4 and the selection lines SSL and GSL. That is, the source/drain inversion layers SD are formed between the channel inversion layers CH. The source/drain inversion layers SD correspond to inversion layers induced by fringing capacitors CF between the word lines WL3 and WL4 and the active region 57a and between the floating gates FG3 and FG4 and the active region 57a, as illustrated in FIG. 5. Thus, the source/drain inversion layers SD may have a different conductivity type from the pocket well 55. For example, when the pocket well 55 is a p-type well, the source/drain inversion layers SD may be n-type inversion layers. As a result, the source/drain inversion layers SD and the channel inversion layers CH are electrically connected to each other to provide one inversion layer INV having a different conductivity type from the pocket well 55. The inversion layer INV may be electrically isolated to have a self-boosted voltage, which depends on the pass voltage $V_P$. The less the space S between the gate patterns is, the easier the formation of the source/drain inversion layers SD may be.

The source/drain inversion layer SD may exhibit a lower impurity concentration as compared to conventional source/drain regions formed using an ion implantation process. Further, a surface concentration of the pocket well 55 may also be lower than that of a pocket well of a conventional NAND-type flash memory device fabricated using a method for increasing a channel concentration to suppress a short channel effect of the selection transistors. Thus, a junction capacitance between the inversion layer INV and the pocket well 55 may significantly decrease, thereby possibly increasing a self-boosting effect of the inversion layer INV. In this case, when an electric field between the inversion layer INV and the second impurity region 69s (i.e., a common source impurity region) increases and the impurity concentration of the active region 57a below the second selection line GSL decreases, a punchthrough phenomenon between the inversion layer INV and the second impurity region 69s may occur. Nevertheless, according to some embodiments of the present invention, the short channel effect of the ground selection transistor may be suppressed due to the presence of the second anti-punchthrough impurity region 67s. The suppression mechanism of the short channel effect of the ground selection transistor, according to some embodiments of the present invention, will be described with reference to FIG. 6.

Figure 6:
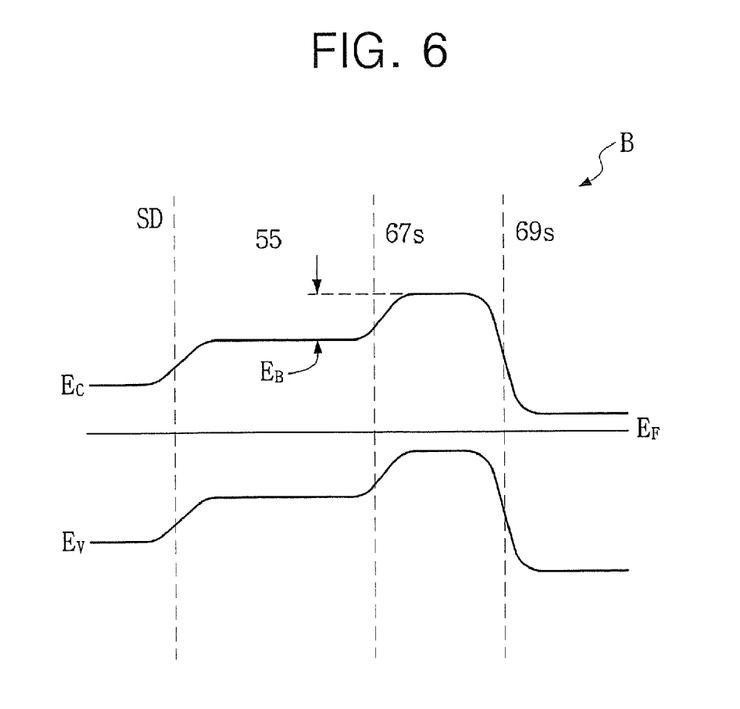
FIG. 6 is an energy band diagram illustrating a channel region of a ground selection transistor shown in FIG. 4 according to some embodiments of the present invention.

FIG. 6 is an energy band diagram of a channel region B below the second selection line GSL of FIG. 4 in an equilibrium state.

Referring to FIG. 6, an energy barrier $E_B$ exists between the second anti-punchthrough impurity region 67s and the pocket well 55. This is because the second anti-punchthrough impurity region 67s has a higher impurity concentration than the pocket well 55 as described above. As a result, even through an electric field is generated between the source/drain inversion layer SD and the second impurity region 69s, the punchthrough phenomenon between the source/drain inversion layer SD and the second impurity region 69s may be inhibited.

Particularly, as illustrated in FIG. 4, the second anti-punchthrough impurity region 67s is provided to be spaced apart from the source/drain inversion layer SD adjacent to the second selection line GSL, and to surround the second impurity region 69s. Thus, the channel hot carrier effect generated in a junction between the source/drain inversion layer SD adjacent to the second selection line GSL and the pocket well 55 may also be significantly suppressed. If the second anti-punchthrough impurity region 67s is provided to surround the source/drain inversion layer SD adjacent to the second selection line GSL, the punchthrough phenomenon between the source/drain inversion layer SD and the second impurity region 69s may be remarkably suppressed whereas the channel hot carrier effect in the junction of the source/drain inversion layer SD may occur.

Though not shown in the drawings, a NAND-type flash memory device may include another non-selected string, which is under a different bias condition from the bias condition shown in FIG. 4 in a program mode. For example, the NAND-type flash memory device may include another non-selected string, which shares a bit line electrically connected to the selected string in a program mode. In this case, when the other non-selected string has the same structure as the string shown in FIG. 3, a bit line and a first selection line (i.e., a string selection line) of the other non-selected string may be grounded, and the same bias condition as shown in FIG. 4 may be applied to other elements (for example, word lines, a second selection line, a common source line and a pocket well). Under such a bias condition, a first anti-punchthrough impurity region (an impurity region corresponding to the first anti-punchthrough impurity region 67b of FIG. 4) of the other non-selected string may have the same function as the second anti-punchthrough impurity region 67s described with reference to FIGS. 4 and 6. That is, a first selection transistor (i.e., a string selection transistor) of the other non-selected string may also exhibit an improved punchthrough characteristic and an improved channel hot carrier effect in a program mode.

A method of fabricating a NAND-type flash memory device, according to some embodiments of the present invention, will now be described.

Referring again to FIG. 3, a deep well 53 of a first conductivity type is formed on a semiconductor substrate 51, and a pocket well 55 of a second conductivity type is formed on the deep well 53. The first and second conductivity types may be n-type and p-type, respectively. An isolation layer (not shown) is formed in a predetermined region of the pocket well 55 to define an active region 57a. First and second selection gate patterns SGP1 and SGP2 are formed to cross over the active region 57a, and first to fourth cell gate patterns WP1, WP2, WP3 and WP4 are formed between the selection gate patterns SGP1 and SGP2. The cell gate patterns WP1, WP2, WP3 and WP4 and the selection gate patterns SGP1 and SGP2 may be formed using a conventional method. The first selection gate pattern SGP1 may be formed to include a string selection line SSL, and the second selection gate pattern SGP2 may be formed to include a ground selection line GSL. Also, the first cell gate pattern WP1 may be formed to include a first floating gate FG1 and a first word line WL1, which are sequentially stacked, and the second cell gate pattern WP2 may be formed to include a second floating gate FG2 and a second word line WL2 which are sequentially stacked. Similarly, the third cell gate pattern WP3 may be formed to include a third floating gate FG3 and a third word line WL3, which are sequentially stacked, and the fourth cell gate pattern WP4 may be formed to include a fourth floating gate FG4 and a fourth word line WL4, which are sequentially stacked.

The selection gate patterns SGP1 and SGP2 may be formed to further include a capping insulating layer 64a stacked on the selection lines SSL and GSL, and the cell gate patterns WP1, WP2, WP3 and WP4 may be formed to further include a capping insulating layer 64b stacked on the word lines WL1, WL2, WL3 and WL4. The selection lines SSL and GSL may be insulated from the active region 57a by a gate insulating layer 63, and the floating gates FG1, FG2, FG3 and FG4 may be insulated from the active region 57a by a tunnel insulating layer 59. An inter-gate insulating layer 61 may be formed between the floating gates FG1, FG2, FG3 and FG4 and the word lines WL1, WL2, WL3 and WL4.

An insulating spacer layer is formed on the substrate having the selection gate patterns SGP1 and SGP2 and the cell gate patterns WP1, WP2, WP3 and WP4, and the spacer layer is etched-back to form spacer patterns 65a filling gap regions between the gate patterns and to form spacers 65b covering outer sidewalls of the selection gate patterns SGP1 and SGP2. The insulating spacer layer may be formed using a process recipe that exhibits poor step coverage. In this case, each of the spacer patterns 65a may have a void therein. When spaces S between the gate patterns decrease, the voids V reduce a parasitic capacitance between the gate patterns. As a result, the delay time of an electrical signal applied to the word lines WL1, WL2, WL3 and WL4 and the selection lines SSL and GSL may be reduced.

Impurity ions of a first conductivity type, for example, n-type impurity ions, are implanted into the active region 57a using the spacer patterns 65a, the spacers 65b and the gate patterns as ion implantation masks, thereby forming first and second impurity regions 69b and 69s, which are adjacent to the first and second selection lines SSL and GSL respectively. Also, impurity ions of a second conductivity type, for example, p-type impurity ions are implanted into the active region 57a using a tilted ion implantation process, thereby forming first and second anti-punchthrough impurity regions 67b and 67s, which surround the first and second impurity regions 69b and 69s, respectively. The process of forming the first and second anti-punchthrough impurity regions 67b and 67s may be performed prior to formation of the first and second impurity regions 69b and 69s.

The tilted ion implantation process for forming the first and second anti-punchthrough impurity regions 67b and 67s may include implanting impurity ions at an angle of about 30° to 60° with respect to the surface of the active region 57a. During the tilted ion implantation process, impurity ions may not be implanted into the active region 57a between the gate patterns. As a result, an impurity region may not be formed in the active region 57a between the first and second anti-punchthrough impurity regions 67b and 67s. Thus, the active region 57a between the first and second anti-punchthrough impurity regions 67b and 67s may have a generally uniform impurity concentration along a direction parallel to the surface of the active region 57a.

First and second elevated semiconductor patterns 71b and 71s may be formed on the first and second impurity regions 69b and 69s, respectively. The first and second elevated semiconductor patterns 71b and 71s may be semiconductor patterns doped with impurities of a first conductivity type, for example, n-type impurities. A cleaning process for removing a native oxide layer on the first and second impurity regions 69b and 69s may be performed prior to formation of the first and second elevated semiconductor patterns 71b and 71s. The elevated semiconductor patterns 71b and 71s may be formed using a selective epitaxial growth technique that uses the first and second impurity regions 69b and 69s as seed layers. In this case, the gate patterns may be formed to include the capping insulating layers 65a and 65b. This is for preventing any other epitaxial semiconductor patterns from being formed on the selection lines SSL and GSL and the word lines WL1, WL2, WL3 and WL4 during formation of the elevated semiconductor patterns 71b and 71s. When the process of forming the elevated semiconductor patterns 71b and 71s is omitted, the process of forming the capping insulating layer 65a and 65b may also be omitted.

In other embodiments of the present invention, when the elevated semiconductor patterns 71b and 71s are formed, the process of forming the first and second impurity regions 69b and 69s and/or the process of forming the first and second anti-punchthrough impurity regions 67b and 67s may be omitted. When the elevated semiconductor patterns 71b and 71s are formed without the process of forming the impurity regions 69b and 69s, impurities in the elevated semiconductor patterns 71b and 71s may be diffused into the active region 57a to form first and second impurity regions 73b and 73s that correspond to the first and second impurity regions 69b and 69s, respectively. In this case, the junction depth of the first and second impurity regions 73b and 73s may be shallower than that of the first and second impurity regions 69b and 69s.

A first interlayer insulating layer 75 is formed on the substrate having the elevated semiconductor patterns 71b and 71s or the first and second impurity regions 69b and 69s, and a source contact plug 77, which is electrically connected to the second elevated semiconductor pattern 71s or the second impurity region 69s, is formed in the first interlayer insulating layer 75. A common source line CSL covering the source contact plug 77 is then formed on the first interlayer insulating layer 75. A second interlayer insulating layer 79 is formed on the substrate having the common source line CSL. A bit line contact plug 81 is formed in the first and second interlayer insulating layers 75 and 79. The bit line contact plug 81 is formed to be in contact with the first elevated semiconductor pattern 71b or the first impurity region 69b. A bit line BL covering the bit line contact plug 81 is formed on the second interlayer insulating layer 79.

According to some embodiments of the present invention described above, an impurity region is not provided in an active region between selection gate patterns and cell gate patterns, and anti-punchthrough impurity regions are provided in an active region adjacent to the selection gate patterns. Alternatively, according to other embodiments of the present invention, any impurity region is not provided in an active region between the selection gate patterns and the cell gate patterns, and elevated semiconductor patterns are provided on an active region adjacent to the selection gate patterns. Thus, a short channel effect and hot carrier effect of a string selection transistor and a ground selection transistor, That which is claimed:

1. A NAND-type flash memory device, comprising:
    first and second impurity regions formed in a semiconductor substrate;
    first and second selection gate patterns disposed on the semiconductor substrate between the first and second impurity regions, the first and second selection gate patterns being adjacent to the first and second impurity regions, respectively;
    a plurality of cell gate patterns disposed between the first and second selection gate patterns;
    a first anti-punchthrough impurity region adjacent to the first impurity region that overlaps a first edge of the first selection gate pattern, wherein the first anti-punchthrough impurity region is eccentric to a center of the first selection date pattern; and
    a second anti-punchthrough impurity region adjacent to the second impurity region that overlaps a second edge of the second selection gate pattern;
    wherein the semiconductor substrate between the first and second anti-punchthrough impurity regions has a substantially uniform impurity concentration along a direction parallel to a surface of the semiconductor substrate.

2. The device according to claim 1, wherein the first and second impurity regions have a different conductivity type from the semiconductor substrate.

3. The device according to claim 1, wherein each of the cell gate patterns comprises a tunnel insulating layer, a floating gate, an inter-gate insulating layer and a control gate electrode, which are sequentially stacked.

4. The device according to claim 1, wherein the first and second anti-punchthrough impurity regions have a same conductivity type as the semiconductor substrate and a higher impurity concentration than the semiconductor substrate.

5. The device according to claim 1, wherein spaces between the selection gate patterns and the cell gate patterns are less than a half width of the cell gate patterns, respectively.

6. The device according to claim 1, further comprising:
    an interlayer insulating layer that covers the cell gate patterns, the selection gate patterns and the first and second impurity regions; and
    a bit line disposed on the interlayer insulating layer;
    wherein the bit line is electrically connected to the first impurity region.

7. The device according to claim 1, wherein the first selection gate pattern includes the first edge adjacent to the first impurity region and a third edge adjacent to the cell gate patterns, and a first distance between the first anti-punchthrough impurity region and the first edge is less than a second distance between the first anti-punchthrough impurity region and the third edge.

8. The device according to claim 1, wherein the second anti-punchthrough impurity region is eccentric to a center of the second selection gate pattern.

9. The device according to claim 1, wherein the second selection gate pattern includes the second edge adjacent to the second impurity region and a fourth edge adjacent to the cell gate patterns, and a third distance between the second anti-punchthrough impurity region and the second edge is less than a fourth distance between the second anti-punchthrough impurity region and the fourth edge.

10. A NAND-type flash memory device, comprising:
    first and second impurity regions formed in a semiconductor substrate;
    first and second selection gate patterns disposed on the semiconductor substrate between the first and second impurity regions, the first and second selection gate patterns being adjacent to the first and second impurity regions, respectively;
    a plurality of cell gate patterns disposed between the first and second selection gate patterns;
    a first anti-punchthrough impurity region adjacent to the first impurity region that overlaps a first edge of the first selection gate pattern;
    a second anti-punchthrough impurity region adjacent to the second impurity region that overlaps a second edge of the second selection gate pattern;
    insulating spacer patterns in gap regions between the cell gate patterns and the selection gate patterns;
    insulating spacers on outer sidewalls of the selection gate patterns adjacent to the first and second impurity regions; and
    first and second elevated semiconductor patterns stacked on the first and second impurity regions, respectively;
    wherein the semiconductor substrate between the first and second anti-punchthrough impurity regions has a substantially uniform impurity concentration along a direction parallel to a surface of the semiconductor substrate, and wherein the insulating spacers are interposed between the elevated semiconductor patterns and the selection gate patterns.

11. The device according to claim 10, wherein the first and second elevated semiconductor patterns are epitaxial semiconductor patterns formed using a selective epitaxial growth technique that uses the first and second impurity regions as seed layers.

12. The device according to claim 10, wherein the first and second elevated semiconductor patterns have a same conductivity type as the first and second impurity regions.

13. The device according to claim 10, wherein each of the insulating spacer patterns has a void therein.

14. A NAND-type flash memory device, comprising:
    first and second elevated semiconductor patterns formed on a semiconductor substrate;
    first and second selection gate patterns disposed on the semiconductor substrate between the first and second elevated semiconductor patterns, the first and second selection gate patterns being adjacent to the first and second elevated semiconductor patterns respectively; and
    a plurality of cell gate patterns disposed between the first and second selection gate patterns;
    wherein the first and second elevated semiconductor patterns have a different conductivity type from the semiconductor substrate, and the semiconductor substrate between the first and second elevated semiconductor patterns has a substantially uniform impurity concentration along a direction parallel to a surface of the semiconductor substrate, and wherein top surfaces of the first and second elevated semiconductor patterns are higher than bottoms of the first and second selection gate patterns.

15. The device according to claim 14, wherein spaces between the selection gate patterns and the cell gate patterns are less than a half width of the cell gate patterns, respectively.

16. The device according to claim 14, further comprising:
insulating spacer patterns in gap regions between the cell gate patterns and the selection gate patterns; and
insulating spacers interposed between the elevated semiconductor patterns and the selection gate patterns.

17. The device according to claim 16, wherein each of the insulating spacer patterns has a void therein.

18. The device according to claim 14, further comprising:
a first anti-punchthrough impurity region that overlaps a first edge of the first selection gate pattern, which is adjacent to the first elevated semiconductor pattern; and
a second anti-punchthrough impurity region that overlaps a second edge of the second selection gate pattern, which is adjacent to the second elevated semiconductor pattern;
wherein the first and second anti-punchthrough impurity regions have a same conductivity type as the semiconductor substrate and a higher impurity concentration than the semiconductor substrate.

19. The device according to claim 14, wherein the first and second elevated semiconductor patterns are epitaxial semiconductor patterns formed using a selective epitaxial growth technique that uses the semiconductor substrate as a seed layer.

20. The device according to claim 14, further comprising:
an interlayer insulating layer that covers the elevated semiconductor patterns, the selection gate patterns and the cell gate patterns; and
a bit line disposed on the interlayer insulating layer;
wherein the bit line is electrically connected to the first elevated semiconductor pattern.

* * * * *